(12) United States Patent  
Ahn et al.

(10) Patent No.: US 8,730,163 B2
(45) Date of Patent: May 20, 2014

(54) FLAT PANEL DISPLAY

(75) Inventors: Soon-Sung Ahn, Yongin (KR); Do-Youb Kim, Yongin (KR); Sung-Un Park, Yongin (KR); Young-Hee Nam, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 475 days.

(21) Appl. No.: 13/028,027

(22) Filed: Feb. 15, 2011

(65) Prior Publication Data

US 2011/0227888 A1 Sep. 22, 2011

(30) Foreign Application Priority Data

Mar. 16, 2010 (KR) .................. 10-2010-0023396

(51) Int. Cl.
G09G 5/10 (2006.01)
(52) U.S. Cl.
USPC .......................................... 345/158; 345/102
(58) Field of Classification Search
USPC .................................................. 345/102, 158
See application file for complete search history.

(56) References Cited

U.S. PATENT DOCUMENTS 4,314,546 A * 2/1982 Miller ............................ 126/578
4,672,191 A * 6/1987 Cofield ...................... 250/203.4
2007/0146296 A1 * 6/2007 Kang et al. .................... 345/102
2007/0296685 A1 12/2007 Kang et al.
2011/0003621 A1 1/2011 Atsumi

FOREIGN PATENT DOCUMENTS

| EP | 1 467 408 A2 | 10/2004 |
| JP | H4-254820 | 9/1992 |
| JP | 2005-070065 | 3/2005 |
| JP | 2009-218647 A | 9/2009 |
| KR | 10-2006-0026537 A | 3/2006 |
| KR | 10-2007-0006334 | 1/2007 |
| KR | 10-2007-0069789 | 7/2007 |
| KR | 10-2007-0121915 | 12/2007 |

OTHER PUBLICATIONS

KIPO Registration Determination Certificate dated Sep. 16, 2011, for application No. 10-2010-0023396, 5 pps.
EPO Search Report dated Jul. 24, 2013, for corresponding European Patent application 11158336.5, (7 pages).

* cited by examiner

*Primary Examiner* — Amare Mengistu
*Assistant Examiner* — Joseph G Rodriguez
(74) *Attorney, Agent, or Firm* — Christie, Parker & Hale, LLP

(57) ABSTRACT

A flat panel display including a first substrate comprising an emission region and a non-emission region, a light emission unit on the emission region, a first sensing unit on the non-emission region, and a second sensing unit on the non-emission region, wherein the first and second sensing units are arranged to allow determination of a tilt angle of the flat panel display using light intensities measured by the first and second sensing units.

20 Claims, 6 Drawing Sheets

FLAT PANEL DISPLAY

CROSS-REFERENCE TO RELATED APPLICATION(S)

This application claims priority to and the benefit of Korean Patent Application No. 10-2010-0023396, filed on Mar. 16, 2010, in the Korean Intellectual Property Office, the disclosure of which is incorporated herein in its entirety by reference.

BACKGROUND

1. Field

One or more embodiments of the present invention relate to a flat panel display.

2. Description of Related Art

Photosensors that convert light signals to electric signals are being developed to provide various functions owing to the developments of the optical industry and the semiconductor industry. In particular, photosensors are built in mobile devices including display units such as mobile phones, digital cameras, and personal digital assistances (PDAs). Image display apparatuses such as liquid crystal displays (LCDs) and organic light emitting devices (OLEDs) may be used to provide touch panel functions to the display devices.

SUMMARY

Additionally, photosensors used in LCDs may be used to adjust the intensity of light emitted from a backlight by sensing external light. Therefore, research involving the use of photosensors to improve the quality of image display apparatuses is ongoing.

Accordingly, an aspect of an embodiment of the present invention provides a flat panel display capable of calculating a tilt angle (e.g., a gradient) of the flat panel display by using a difference between intensities of light incident on two or more different photosensors.

Additional aspects of embodiments of the present invention will be set forth in, or will be apparent from, the following description, or may be learned by practice of the presented embodiments.

In order to achieve the foregoing and/or other aspects of the present invention, according to one or more embodiments of the present invention, there is provided a flat panel display including: a first substrate including an emission region and a non-emission region; a light emission unit on the emission region; a first sensing unit on the non-emission region; and a second sensing unit on the non-emission region, wherein the first and second sensing units are arranged to allow determination of a tilt angle of the flat panel display using light intensities measured by the first and second sensing units.

The flat panel display may further include a second substrate on the light emission unit and a bonding member for bonding the first substrate and the second substrate together.

The first sensing unit may include a first photosensor and the second sensing unit may include a second photosensor and a light shielding member.

The light shielding member may be adjacent the second photosensor.

The light shielding member may be adjacent at least one side of the second photosensor.

The light shielding member may contact a side of the second photosensor.

A height of the light shielding member may be greater than a height of the second photosensor.

A width of the light shielding member may be less than or equal to a width of the second photosensor.

The light shielding member may be pillar-shaped.

The light shielding member may be perpendicular to a surface of the first substrate.

A height of the light shielding member may be less than or equal to a height of the bonding member.

The first sensing unit may be configured to measure a first intensity of light incident on the first sensing unit, the second sensing unit may be configured to measure a second intensity of light incident on the second sensing unit, such that the tilt angle of the flat panel display may be determinable by comparing the second light intensity to the first light intensity.

The second light intensity may be reduced at a rate that exceeds a rate of reduction of the first light intensity as the flat panel display is tilted.

The first sensing unit may be configured to measure a first intensity of light incident on the first sensing unit, the second sensing unit may be configured to measure a second intensity of light incident on the second sensing unit, such that the tilt angle of the flat panel display may be determinable by using a ratio of the second light intensity to the first light intensity.

The ratio of the second light intensity to the first light intensity may be decreased when the tilt angle is increased.

The flat panel display may further include a look-up table for storing various ratios of the second light intensity to the first light intensity corresponding to various tilt angles of the flat panel display.

The first sensing unit and the second sensing unit may be on the non-emission region so as to be substantially symmetrically located about the light emission unit.

The emission region may be on a center portion of the first substrate, and the non-emission region may be on a peripheral portion of the first substrate.

The flat panel display may further include a look-up table for storing various intensities measured by the first and second sensing units corresponding to various tilt angles of the flat panel display.

The flat panel display may further include a backlight, wherein light emitted by the backlight may be adjusted according to the tilt angle of the flat panel display.

In a flat panel display according to embodiments of the present invention, because the tilt angle of the flat panel display may affect an amount of light incident on the flat panel display that is shielded by the light shielding element, which in turn affects the intensity of the light perceived by the second sensing unit, and because the first sensing unit might not be similarly affected, as it might not have a similar light shielding element, the intensity of light perceived by the second sensing unit can be compared to the intensity of light perceived by the first sensing unit to determine the tilt angle of the flat panel display.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Figure 1:
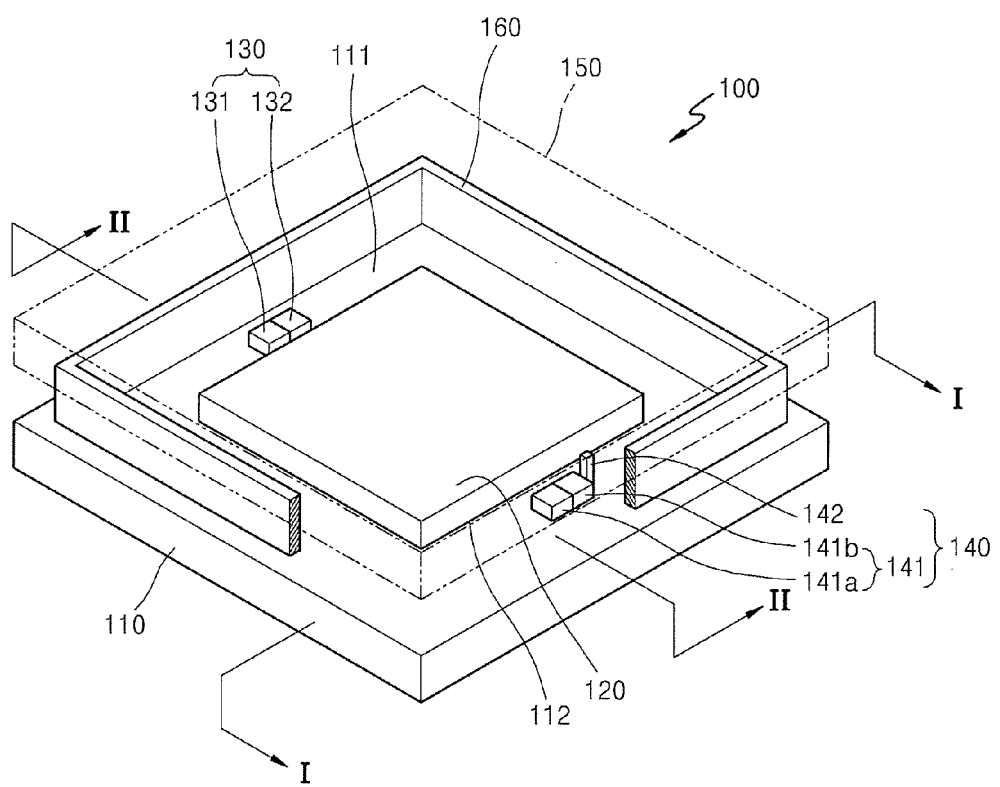
FIG. 1 is a cutaway perspective view illustrating a flat panel display according to one embodiment of the present invention.

Hereinafter, certain exemplary embodiments according to the present invention will be described with reference to the accompanying drawings with like reference numerals referring to like elements throughout. Some of the elements that are not essential to a complete understanding of the invention are omitted for clarity. In this regard, the embodiments of the present invention may have different forms, and should not be construed as being limited to the descriptions set forth herein. Accordingly, hereinafter the exemplary embodiments of the present invention are merely described in detail with reference to FIGS. 1 to 8 to explain aspects of embodiments according to the present invention.

FIG. 1 is a cutaway perspective view illustrating a flat panel display 100 according to one embodiment of the present invention.

Referring to FIG. 1, the flat panel display 100 may include a first substrate 110, a light emission unit 120, a first sensing unit 130, a second sensing unit 140, a second substrate 150, and a bonding member 160.

The flat panel display 100 according to one embodiment of the present invention is an organic light emitting display apparatus. In other embodiments, the flat panel display 100 may be a liquid crystal display (LCD), a plasma display panel (PDP), or some other suitable type of display.

The flat panel display 100 of one embodiment according to the present invention includes the first substrate 110 facing the second substrate 150, and edge portions (e.g., peripheral portions) of the first substrate 110 and the second substrate 150 may be sealed by the bonding member 160.

The first substrate 110 may be divided into a non-emission region 111 and an emission region 112, wherein the light emission unit 120 is located on the emission region 112. The emission region 112 is located on a center portion of the first substrate 110, and the non-emission region 111 is located on peripheral portions of the first substrate 110. In other embodiments, the emission region 112 and the non-emission region 111 may be located at other locations. The first sensing unit 130 and the second sensing unit 140 are located on the non-emission region 111, which will be described in further detail below.

Figure 2:
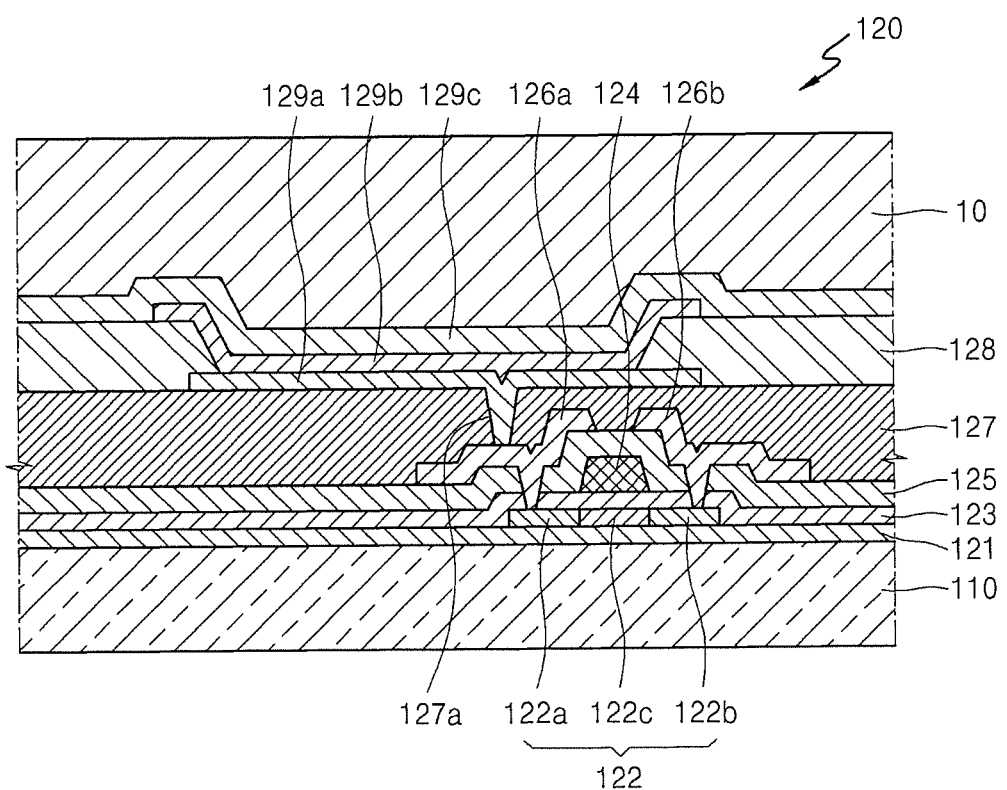
FIG. 2 is a cross-sectional view illustrating a light emission unit of the embodiment of the present invention shown in FIG. 1.

FIG. 2 is a cross-sectional view illustrating a light emission unit 120 according to the embodiment of the present invention shown in FIG. 1.

Referring to FIG. 2, an insulating layer 121 such as a barrier layer and/or a buffer layer may be formed on an upper surface of the first substrate 110 in order to prevent or reduce impurity ions from diffusing, to prevent or reduce humidity or external air from infiltrating in the first substrate 110, and/or to more closely planarize the upper surface of the first substrate 110.

An active layer 122 of a thin film transistor (TFT) is formed on the insulating layer 121 by using one or more semiconductor materials, and a gate insulating layer 123 is formed on the first substrate 110 to cover the active layer 122. The active layer 122 may be formed of an inorganic semiconductor, such as amorphous silicon or polysilicon, or may be formed of an organic semiconductor. The active layer 122 has a source region 122a and a drain region 122b on two sides of a channel region 122c.

A gate electrode 124 is formed on the gate insulating layer 123, and an interlayer dielectric 125 is formed on the gate insulating layer 123 to cover the gate electrode 124. In addition, a source electrode 126a and a drain electrode 126b are formed on the interlayer dielectric 125, and a planarization layer 127 and a pixel definition layer 128 are formed (e.g., sequentially formed in the order stated) to cover the source and drain electrodes 126a and 126b.

The gate insulating layer 123, the interlayer dielectric 125, the planarization layer 127, and the pixel definition layer 128 may be formed of an insulating material, and may be formed in a single-layered structure or a multi-layered structure including an organic material, an inorganic material, and/or an organic/inorganic compound material.

The present invention is not limited to the above-described stacked structure of the TFT, and TFTs having various structures may be used.

Also, a pixel electrode 129a, which is an electrode included in an OLED, is formed on the planarization layer 127, and the pixel definition layer 128 is formed on the pixel electrode 129a. Furthermore, an opening (e.g., a predetermined opening) is formed in the pixel definition layer 128 to expose the pixel electrode 129a, and an organic emission layer 129b of the OLED is formed on the exposed portion of the pixel electrode 129a.

The OLED may display image information (e.g., predetermined image information) by emitting red, green, or blue light according to the flow of electric current. The OLED includes the pixel electrode 129a that contacts the source electrode 126a of the TFT via a contact hole 127a formed in the planarization layer 127, an opposite electrode 129c located to cover all the pixels of the OLED, and the organic emission layer 129b located between the pixel electrode 129a and the opposite electrode 129c to emit light.

The pixel electrode 129a and the opposite electrode 129c are insulated from each other by the organic emission layer 129b and may be used to apply voltages of different polarities to the organic emission layer 129b to make the organic emission layer 129b emit light.

The organic emission layer 129b may be a low molecular weight organic film or a polymer organic film. The organic emission layer 129b may be formed by stacking a hole injection layer (HIL), a hole transport layer (HTL), an emission layer (EML), an electron transport layer (ETL), and an electron injection layer (EIL). The organic emission layer 129b may be formed in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). These layers may be formed by vacuum deposition. At this point, the HIL, the HTL, the ETL, and the EIL are common layers and may be commonly applied to red, green, and blue pixels. Accordingly, unlike the organic emission layer 129b in FIG. 2, the common layers may be formed to cover all of the pixels, in a similar manner as, for example, the opposite electrode 129c.

The pixel electrode 129a functions as an anode electrode, and the opposite electrode 129c functions as a cathode electrode. However, the present invention is not limited thereto, and the polarities of the pixel electrode 129a and the opposite electrode 129c may be reversed in other embodiments.

If the OLED is a bottom emission type display, in which images are displayed towards the first substrate 110, the pixel electrode 129a may be a transparent electrode, and the opposite electrode 129c may be a reflection electrode. Here, the pixel electrode 129a may be formed of an oxide having a high work function, such as indium tin oxide (ITO), indium zinc oxide (IZO), ZnO, or $In_2O_3$, and the opposite electrode 129c may be formed of a metal having a low work function, such as, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

If the OLED is a top emission type display, in which images are displayed towards the opposite electrode 129c, the pixel electrode 129a may be a reflection electrode, and the opposite electrode 129c may be a transparent electrode. Here, the pixel electrode 129a may include a reflection film formed of Ag, Mg, Al, Pt, Pd, Au, Ni, Nd, Ir, Cr, Li, Ca, a compound of these materials, or an oxide having a high work function, such as, for example, ITO, IZO, ZnO, or $In_2O_3$. In addition, the opposite electrode 129c may be formed by first depositing a metal having a low work function, such as, for example, Ag, Mg, Al, Pt, Pd, Au, Ni, Nd, Ir, Cr, Li, Ca, or a compound of these materials, and then by forming an auxiliary electrode layer or a bus electrode line by using a transparent conductive material such as, for example, ITO, IZO, ZnO, or $In_2O_3$.

If the OLED is a double emission type display, both the pixel electrode 129a and the opposite electrode 129c may be formed as transparent electrodes.

When the first substrate 110 is mounted on a frame, the OLED is a top emission type display, and the images may be displayed toward the second substrate 150. When an opening (e.g., a predetermined opening) is formed in the frame and a bottom surface of the first substrate 110 is exposed through the opening, the OLED may be a bottom emission type display or a double emission type display.

The materials of the pixel electrode 129a and the opposite electrode 129c are not limited to the above examples, and the pixel electrode 129a and the opposite electrode 129c may be formed of a conductive organic material or a conductive paste including conductive particles such as Ag, Mg, or Cu. When the conductive paste is used to form the pixel electrode 129a and the opposite electrode 129c, an inkjet printing method may be used to print the materials, and a baking process may be performed to form the pixel electrode 129a and the opposite electrode 129c.

A passivation layer 10 composed of an inorganic material, an organic material, or an inorganic/organic compound material may be further formed on the opposite electrode 129c to cover the light emission unit 120.

The present invention is not limited to the above-described formation, composition, or structure of the OLED and its corresponding components and layers, nor is the present invention limited to the above-described materials, as various displays of various structures and materials may be used.

Figure 3:
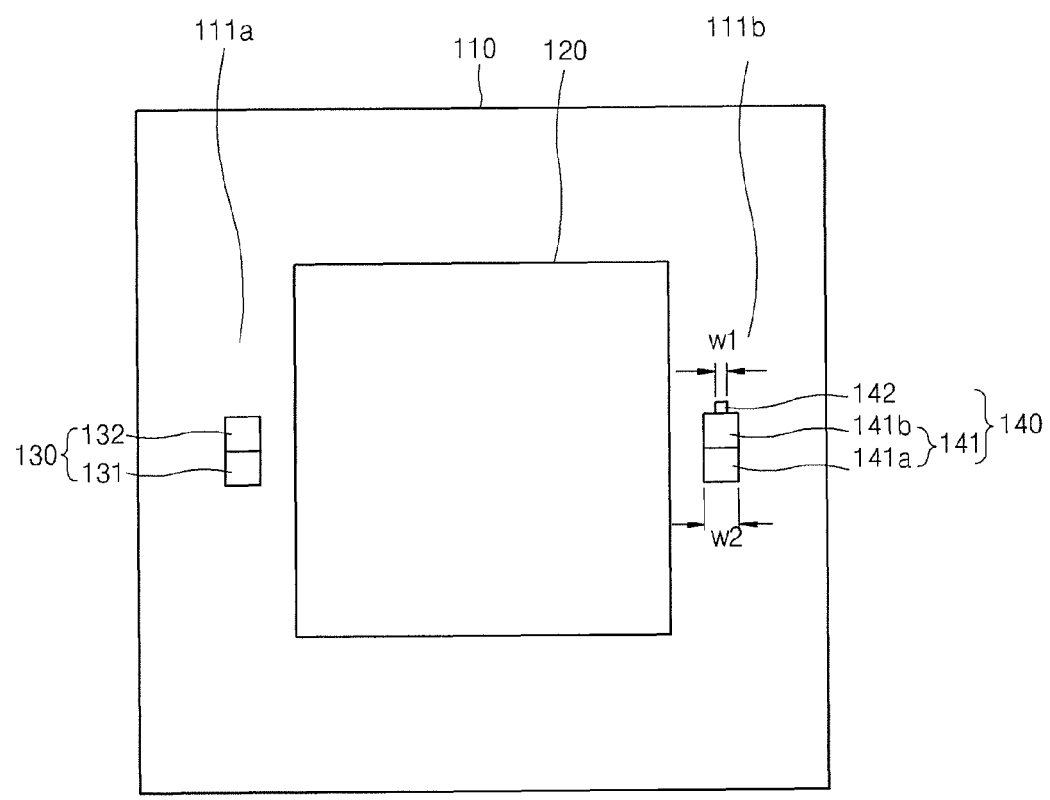
FIG. 3 is a top view illustrating the flat panel display of the embodiment of the present invention shown in FIG. 1.

FIG. 3 is a top view illustrating the flat panel display 100 according to the embodiment of the present invention shown in FIG. 1.

Referring to FIGS. 1 and 3, the first sensing unit 130 and the second sensing unit 140 are located on the flat panel display 100 to measure intensities of light incident from outside of the flat panel display 100. The first and second sensing units 130 and 140 may be located on the non-emission region 111 of the first substrate 110. The non-emission region 111 may be a region corresponding to an outer portion of the emission region 112 and an inner portion of the bonding member 160. The first and second sensing units 130 and 140 may be symmetrically or substantially symmetrically arranged about the light emission unit 120.

Referring to FIG. 3, in one embodiment of the present invention, the first and second sensing units 130 and 140 are respectively located on a left non-emission region 111a and a right non-emission region 111b of the light emission unit 120, have substantially the same or identical heights, and are located symmetrically or substantially symmetrically about the light emission unit 120. As described above, according to the flat panel display 100 of the present embodiment, since the first and second sensing units 130 and 140 are located symmetrically or substantially symmetrically about the light emission unit 120, a difference between light intensities that may be generated if the first and second sensing units 130 and 140 are asymmetric with respect to each other may be reduced or prevented. That is, external light may be incident on the first and second sensing units 130 and 140 under the same or similar conditions for each sensing unit 130 and 140, and variations in the intensities of incident light depending on the location and orientation of the first and second sensing units 130 and 140 may be reduced. It should be understood that the present invention is not limited to the above-mentioned locations of the sensing units 130 and 140, as different arrangements may be used.

In one embodiment of the present invention, the first sensing unit 130 may include a first photosensor. The first photosensor 130 may be a PN junction optical diode and may include a first light receiving layer 131 and a second light receiving layer 132. The first light receiving layer 131 may be an N-type layer in the PN junction optical diode 130, and the second light receiving layer 132 may be a P-type layer in the PN junction optical diode 130. Alternatively, the first light receiving layer 131 may be a P-type layer in the PN junction optical diode 130, and the second light receiving layer 132 may be an N-type layer in the PN junction optical diode 130.

When the first light receiving layer 131 is an N-type layer, the first light receiving layer 131 may include one or more elements selected from the group consisting of gallium (Ga), indium (In), zinc (Zn), and tin (Sn), and combined with oxygen (O). For example, the first light receiving layer 131 may include ZnO, ZnGaO, ZnInO, GaInO, GaSnO, ZnSnO, InSnO, or ZnGaInO.

When the second light receiving layer 132 is a P-type layer, the second light receiving layer 132 may include a phthalocyanine compound including one or more metals selected from the group consisting of Cu, Fe, Ni, Co, Mn, Al, Pd, Sn, In, Pb, Ti, Rb, V, Ga, Tb, Ce, La, and Zn.

In another embodiment of the present invention, the first photosensor 130 may be a PIN junction optical diode.

The second sensing unit 140 may include a second photosensor 141 and a light shielding member 142. The second photosensor 141 may be a PN junction optical diode. The second photosensor 141 may include a first light receiving layer 141a and a second light receiving layer 141b. The first light receiving layer 141a may be an N-type layer of the PN junction optical diode 141, and the second light receiving layer 141b may be a P-type layer of the PN junction optical diode 141. Otherwise, the first light receiving layer 141a may be a P-type layer of the PN junction optical diode 141, and the second light receiving layer 141 may be an N-type layer of the PN junction optical diode 141.

If the first light receiving layer 141a is an N-type layer, the first light receiving layer 141a may include one or more selected from the group consisting of Ga, In, Zn, and Sn, and combined with O. For example, the first light receiving layer 141a may include a material such as ZnO, ZnGaO, ZnInO, GaInO, GaSnO, ZnSnO, InSnO, or ZnGaInO.

If the second light receiving layer 141b is a P-type layer, the second light receiving layer 141b may include a phthalocyanine compound including one or more metals selected from the group consisting of Cu, Fe, Ni, Co, Mn, Al, Pd, Sn, In, Pb, Ti, Rb, V, Ga, Tb, Ce, La, and Zn.

In one embodiment of the present invention, the light shielding member 142 may be arranged to contact a side of the second photosensor 141. Furthermore, the light shielding member 142 may be arranged to contact an upper end portion of the second photosensor 141. However, the present invention is not limited thereto, and the light shielding member 142 may be arranged to contact other portions (e.g., sides) of the second photosensor 141 without contacting the upper end portion of the second photosensor 141. Furthermore, the light shielding member 142 may be arranged to not contact the second photosensor. Also, the light shielding member 142 may be pillar-shaped.

Figure 4:
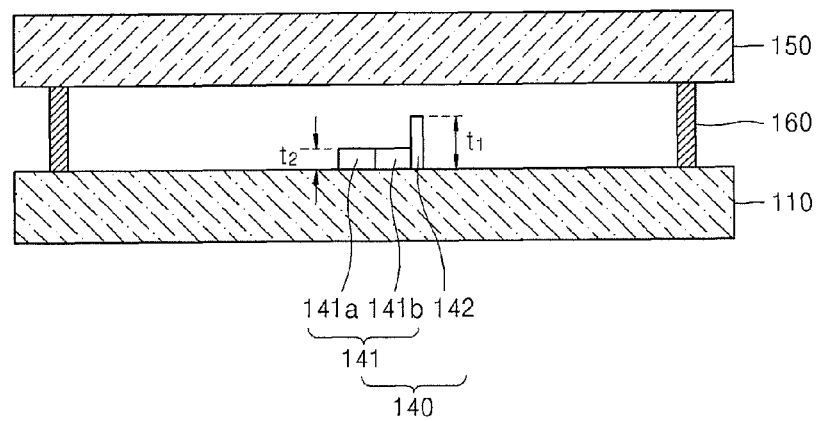
FIG. 4 is a cross-sectional view illustrating the flat panel display of the embodiment of the present invention shown in FIG. 1 taken along the line I-I of FIG. 1.
Figure 5:
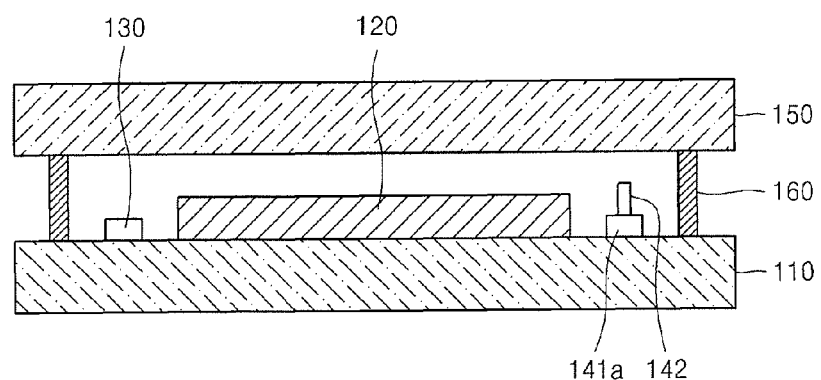
FIG. 5 is a cross-sectional view illustrating the flat panel display of the embodiment of the present invention shown in FIG. 1 taken along the line II-II of FIG. 1.

FIG. 4 is a cross-sectional view illustrating the flat panel display 100 of the embodiment of the present invention shown in FIG. 1 and taken along the line I-I of FIG. 1, and FIG. 5 is a cross-sectional view illustrating the flat panel display 100 of the embodiment of the present invention shown in FIG. 1 and taken along the line II-II of FIG. 1.

Referring to FIGS. 3-5, the light shielding member 142 may have a width w1 that is less than a width w2 of the second photosensor 141, and may have a height t1 that is greater than a height t2 of the second photosensor 141. The light shielding member 142 may be formed with a height that is equal to or smaller than a height of the bonding member 160. The light shielding member 142 located on the side of the second photosensor 141 may reduce luminous flux of the light incident on the second photosensor 141. Accordingly, there may be a difference between the intensities of light incident on the first photosensor 130 and second photosensor 141, and thus, a tilt angle (e.g., a gradient) of the flat panel display 100 may be calculated by using such a difference. This will be described later in more detail.

It should be noted that the present invention is not limited to the above-mentioned dimensions, locations, or orientations of the fight shielding member 142, nor to the foregoing materials and arrangements, as they are provided merely as examples.

Figure 6:
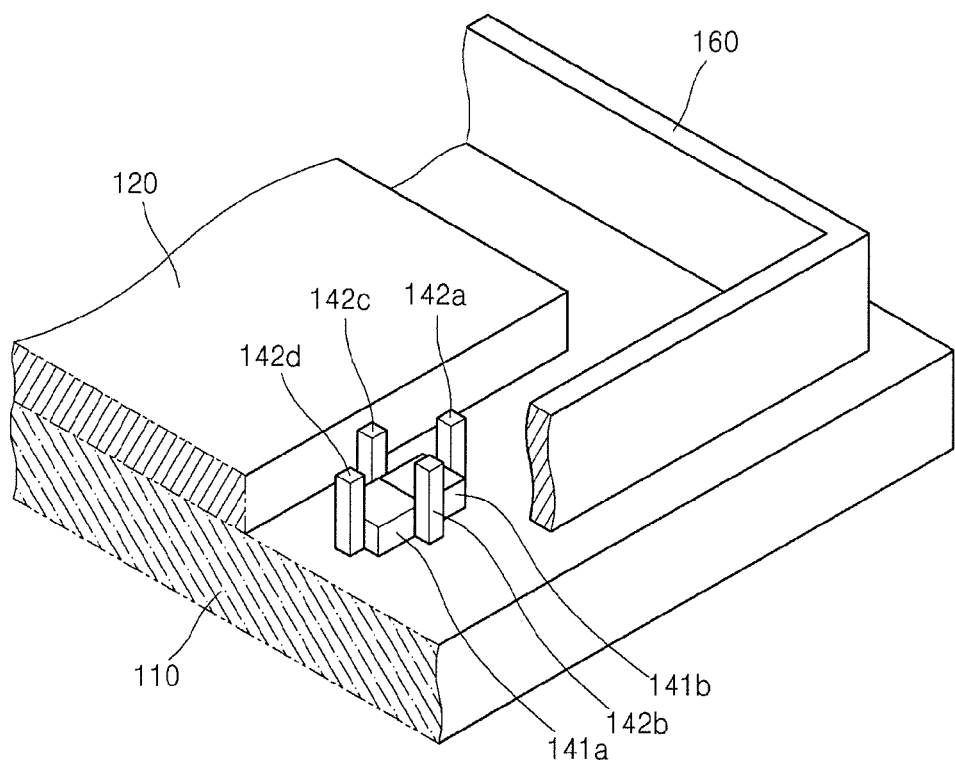
FIG. 6 is a partial perspective view illustrating a second sensing unit in the flat panel display apparatus, according to one embodiment of the present invention.

FIG. 6 is a partial perspective view of a second sensing unit 140 of the flat panel display 100 according to another embodiment of the present invention.

Referring to FIG. 6, light shielding members 142a, 142b, 142c, and 142d may be respectively located at or near four sides of the second photosensor 141. However, the present invention is not limited thereto (e.g., at least one of the light shielding members 142a, 142b, 142c, and 142d may be located on or near a side of the second photosensor 141).

Figure 7:
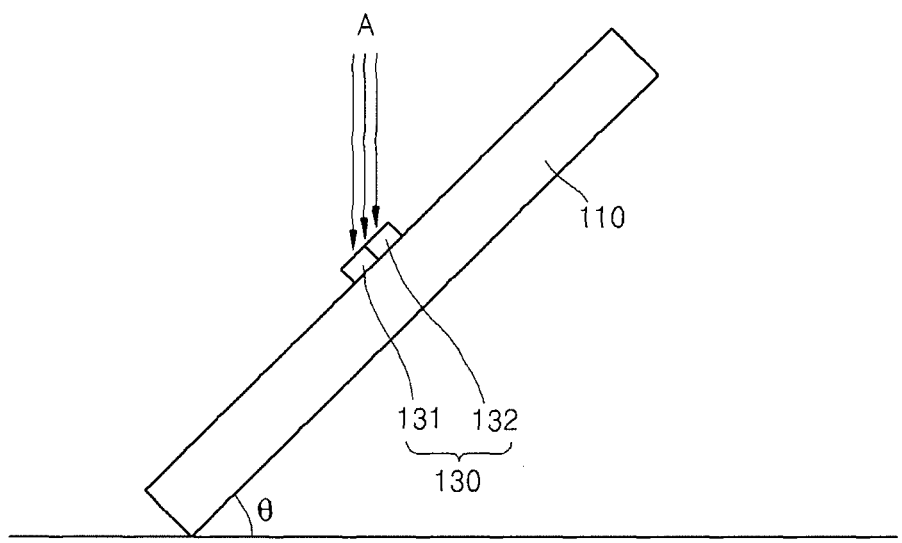
FIGS. 7 and 8 are side views illustrating operations of the flat panel display according to one embodiment of the present invention.
Figure 8:
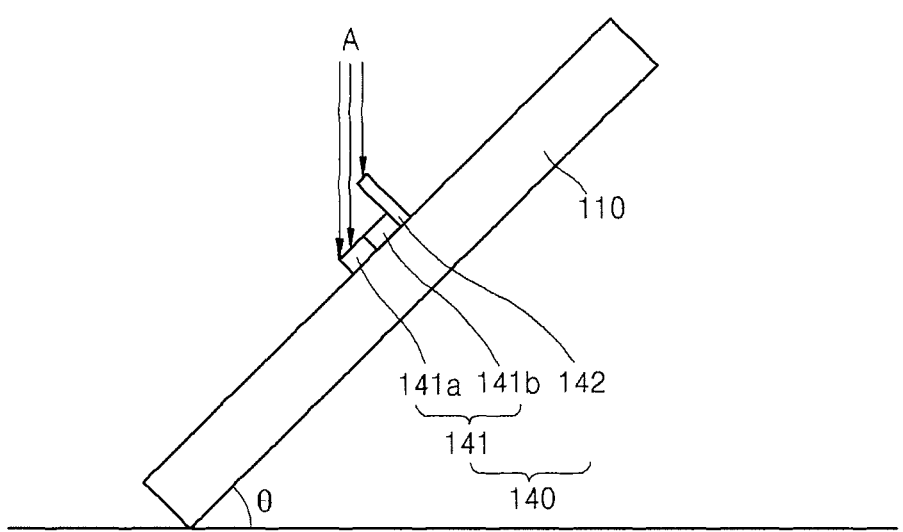

FIGS. 7 and 8 are side views illustrating operations of the flat panel display 100 according to one embodiment of the present invention. FIG. 7 is a view of the flat panel display 100 seen from a side of the first sensing unit 130, and FIG. 8 is a view of the flat panel display 100 seen from a side of the second sensing unit 140, wherein the flat panel display 100 is tilted at a predetermined tilt angle θ with respect to the ground.

Referring to FIGS. 7 and 8, as the flat panel display 100 is tilted (e.g., tilted with respect to the ground), some of the light proceeding toward the second photosensor 141 may be blocked by the light shielding member 142, and therefore might not be incident on the second photosensor 141. However, since there is no unit for shielding the light proceeding toward the first photosensor 130 in the described embodiment, the light proceeding toward the first photosensor 130 may be incident on the first photosensor 130 with little or no interference. As the flat panel display 100 becomes perpendicular to the ground, the light shielding member 142 may shield more light, the amount of light incident on the second photosensor 141 may be reduced, and the difference between the intensities of the light incident on the first photosensor 130 and on the second photosensor 141 might become larger. It should be noted that although there is no light shielding member corresponding to the first photosensor 130 in the described embodiment, the present invention is not limited thereto.

On the other hand, when a tilt angle of the flat panel display 100 with respect to the ground is reduced, the intensity of the light blocked by the light shielding member 142 is reduced, and the difference between the intensities of the light incident on the second photosensor 141 and the light incident on the first photosensor 130 is reduced. When the flat panel display 100 is not tilted with respect to the ground, there may be little or no light shielded by the light shielding member 142, and thus, the intensities of the light incident on the first photosensor 130 and the light incident on the second photosensor 141 may be approximately equal to each other.

That is, assuming that the intensity of the light incident on the first photosensor 130 is a first light intensity and the intensity of the light incident on the second photosensor 141 is a second light intensity, as the flat panel display 100 is tilted with respect to the ground, and the tilt angle θ between the flat panel display 100 and the ground increases, the second light intensity may be reduced by the light shielding member 142 and a ratio of the second light intensity to the first light intensity may decrease. Additionally, as the flat panel display 100 becomes parallel with the ground, and the tilt angle θ between the flat panel display 100 and the ground is reduced, the amount of light shielded by the light shielding member 142 may be reduced, and a ratio of the second light intensity to the first light intensity may increase. The ratio of the second light intensity with respect to the first light intensity might not be indefinitely increased. When the flat panel display 100 is parallel with the ground surface and the external light is perpendicularly incident on the flat panel display 100, the first light intensity and the second light intensity may be equal or approximately equal to each other, and the ratio of the second light intensity to the first light intensity may approach or become 1.

As described above, since the ratio of the second light intensity to the first light intensity is decreased (or a ratio of the first light intensity with respect to the second light intensity is increased) as the tilt angle θ of the flat panel display 100 with respect to the ground increases, the tilt angle of the flat panel display 100 may be calculated by measuring the first and second light intensities and calculating their ratio. The relations between the ratio of the second light intensity to the first light intensity, and/or its inverse (i.e., the ratio of the first light intensity with respect to the second light intensity), and the tilt angle of the flat panel display 100 may be listed in a look-up table and stored, and thus, the tilt angle of the flat panel display 100 may be calculated by measuring the first and second light intensities, calculating a ratio, and using the look-up table. It should be noted that the tilt angle of the flat panel display 100 may similarly by calculated to a reference other than the ground, and that the present invention is, therefore, not limited thereto.

According to the flat panel display 100 of the embodiments of the present invention, the tilt angle of the flat panel display 100 may be easily calculated using the first and second sensing units 130 and 140 in the absence of using an additional gyro sensor or a light intensity sensor.

While the present invention has been described in connection with certain exemplary embodiments, it is to be understood that the exemplary embodiments described herein should be considered in a descriptive sense only, and that the invention is not limited to the disclosed embodiments, but, on the contrary, is intended to cover various modifications and equivalent arrangements included within the spirit and scope of the appended claims, and equivalents thereof. Furthermore, descriptions of features or aspects within each embodiment should typically be considered as available for other similar features or aspects in other embodiments.

What is claimed is:

1. A flat panel display comprising:
   a first substrate comprising an emission region and a non-emission region;
   a light emission unit on the emission region;
   a device for measuring a tilt angle of the flat panel display, the device comprising:
      a first sensing unit on the non-emission region at a first side of the first substrate; and
      a second sensing unit on the non-emission region at a second side of the first substrate opposite the first side, and comprising a light-shielding member,
   wherein the first and second sensing units are arranged to allow determination of the tilt angle of the flat panel display using light intensities measured by the first and second sensing units,
   and wherein no light-shielding member is adjacent the first sensing unit.

2. The flat panel display of claim 1 further comprising:
   a second substrate on the light emission unit; and
   a bonding member for bonding the first substrate and the second substrate together.

3. The flat panel display of claim 1, wherein the first sensing unit comprises a first photosensor and the second sensing unit comprises a second photosensor.

4. The flat panel display of claim 3, wherein the light-shielding member is adjacent the second photosensor.

5. The flat panel display of claim 3, wherein the light-shielding member is adjacent at least one side of the second photosensor.

6. The flat panel display of claim 3, wherein the light-shielding member contacts a side of the second photosensor.

7. The flat panel display of claim 3, wherein a height of the light-shielding member is greater than a height of the second photosensor.

8. The flat panel display of claim 3, wherein a width of the light-shielding member is less than or equal to a width of the second photosensor.

9. The flat panel display of claim 3, wherein the light-shielding member is pillar-shaped.

10. The flat panel display of claim 3, wherein the light-shielding member is perpendicular to a surface of the first substrate.

11. The flat panel display of claim 2, wherein a height of the light-shielding member is less than or equal to a height of the bonding member.

12. The flat panel display of claim 1, wherein the first sensing unit is configured to measure a first intensity of light incident on the first sensing unit, and wherein the second sensing unit is configured to measure a second intensity of light incident on the second sensing unit, such that the tilt angle of the flat panel display is determinable by comparing the second light intensity to the first light intensity.

13. The flat panel display of claim 12, wherein the second light intensity is reduced at a rate that exceeds a rate of reduction of the first light intensity as the flat panel display is tilted.

14. The flat panel display of claim 1, wherein the first sensing unit measures a first intensity of light incident on the first sensing unit, the second sensing unit measures a second intensity of light incident on the second sensing unit, and the tilt angle of the flat panel display is determinable by using a ratio of the second light intensity to the first light intensity.

15. The flat panel display of claim 14, wherein the ratio of the second light intensity to the first light intensity is decreased when the tilt angle is increased.

16. The flat panel display of claim 14 further comprising a look-up table for storing various ratios of the second light intensity to the first light intensity corresponding to various tilt angles of the flat panel display.

17. The flat panel display of claim 1, wherein the first sensing unit and the second sensing unit are on the non-emission region so as to be substantially symmetrically located about the light emission unit.

18. The flat panel display of claim 1, wherein the emission region is on a center portion of the first substrate, and the non-emission region is on a peripheral portion of the first substrate.

19. The flat panel display of claim 1 further comprising a look-up table for storing various intensities measured by the first and second sensing units corresponding to various tilt angles of the flat panel display.

20. The flat panel display of claim 1, further comprising a backlight, wherein light emitted by the backlight is adjusted according to the tilt angle of the flat panel display.

* * * * *